United States Patent
Schrock

(12) 
(10) Patent No.: US 6,707,152 B1
(45) Date of Patent: Mar. 16, 2004

(54) SEMICONDUCTOR DEVICE, ELECTRICAL CONDUCTOR SYSTEM, AND METHOD OF MAKING

(75) Inventor: Edward A. Schrock, Boise, ID (US)

(73) Assignee: Micron Technology, Inc., Boise, ID (US)

(*) Notice: Subject to any disclaimer, the term of this patent is extended or adjusted under 35 U.S.C. 154(b) by 465 days.

(21) Appl. No.: 09/292,745

(22) Filed: Apr. 16, 1999

(51) Int. Cl.[7] ............................................. H01C 23/48
(52) U.S. Cl. .................. 257/738; 257/772; 257/774; 257/780; 257/784; 257/779; 257/787
(58) Field of Search ................. 257/738, 772, 257/774, 780, 784, 779, 787

(56) References Cited

U.S. PATENT DOCUMENTS

| | | | | |
|---|---|---|---|---|
| 4,732,649 A | * | 3/1988 | Larson et al. | 156/652 |
| 4,789,914 A | * | 12/1988 | Ainslie et al. | 360/103 |
| 5,031,360 A | | 7/1991 | Farnworth et al. | |
| 5,495,669 A | * | 3/1996 | Legrandy et al. | 29/885 |
| 5,583,378 A | | 12/1996 | Marrs et al. | |
| 5,633,535 A | | 5/1997 | Chao et al. | |
| 5,736,456 A | | 4/1998 | Akram | |
| 5,742,483 A | * | 4/1998 | Ma et al. | 361/777 |
| 5,756,380 A | * | 5/1998 | Berg et al. | 438/126 |

FOREIGN PATENT DOCUMENTS

| | | |
|---|---|---|
| EP | 0 971 570 A1 | 4/2000 |
| JP | 58-82540 | 5/1983 |
| JP | 4-111456 | 4/1992 |
| JP | 4-155949 | 5/1992 |
| JP | 406338535 | * 12/1994 |
| JP | 406338535 A | * 12/1994 |
| WO | WO98/34447 | 8/1998 |

* cited by examiner

*Primary Examiner*—Evan Pert
*Assistant Examiner*—Luan Thoi
(74) *Attorney, Agent, or Firm*—Dickstein Shapiro Morin & Oshinsky LLP

(57) ABSTRACT

A semiconductor device is provided with copper traces for connecting active elements to an external device, and insulating layers of black oxide (cupric oxide) are formed on the traces. The active elements may be, for example, conductors on the active surface of a semiconductor die. The external device may be, for example, a memory device or an input/output device. The invention eliminates the need for a resist solder mask. The black oxide prevents solder from adhering to the traces except where desired. The black oxide layers preferably do not cover the entire surfaces of the semiconductor device. The oxide layers grow only on the surfaces of the copper traces. Consequently, the dimensions of the finished device may be minimized. Black oxide may also be used to promote adhesion between the die and the substrate.

19 Claims, 2 Drawing Sheets

SEMICONDUCTOR DEVICE, ELECTRICAL CONDUCTOR SYSTEM, AND METHOD OF MAKING

BACKGROUND OF THE INVENTION

1. Field of the Invention

The present invention relates generally to semiconductor devices with metal conductive traces. The present invention also relates to the use of metal oxide, especially copper oxide, to cover or mask selected portions of conductive patterns in semiconductor devices. The present invention also relates to methods of making semiconductor devices, and to methods of making electrical conductor systems for use in semiconductor devices.

2. Discussion of the Related Art

U.S. Pat. No. 5,756,380 (Berg et al.) describes a method of making a semiconductor device with conductive copper traces. The copper traces are patterned on an organic substrate, and then a resist solder mask is formed on the traces. The resist mask covers everything but certain contact portions of the traces. The exposed contact portions are gold plated to prevent oxidation, and then solder balls are attached to the respective gold plates. The resist mask prevents solder from flowing between the contact portions or down the copper traces.

There are several disadvantages associated with resist solder masks of the type shown in the Berg et al. patent. In particular, extra processing steps are required to coat the resist material onto the device and strip off the residual material. In addition, the resist material may interfere with the adhesion of the chip to the rest of the device. In addition, delamination of the resist mask may cause quality control problems. Such delamination is exhibited in preconditioned reflow tests (PRT) or "popcorn" tests. For these and other reasons, it would be advantageous to make semiconductor devices without resist solder masks of the type shown in the Berg et al. patent.

SUMMARY OF THE INVENTION

The disadvantages of the prior art are overcome to a great extent by the present invention. The present invention relates to a semiconductor device that has metal traces for connecting active elements to an external device, and insulating layers formed of metal oxide on the traces. The active elements may be, for example, conductors on the active surface of a semiconductor die (or chip). The external device may be, for example, a memory device or an input/output device.

According to a preferred embodiment of the invention, the semiconductor device does not have a resist solder mask. An advantage of the invention is that it eliminates the need for a resist solder mask. By not using a resist solder mask, the disadvantages mentioned above may be avoided.

In one aspect of the invention, conductive metal traces are covered by insulating layers of cupric oxide (CuO), also known as "black oxide." The present invention should not be limited to the preferred embodiment, however. Other metal oxides such as cuprous oxide ($Cu_2O$), aluminum oxide, and the like, may also be used. Gold may be used to prevent oxidation of the portions of the copper traces that are not intended to be covered by metal oxide.

In another aspect of the invention, copper traces are partially covered by black oxide and used to provide electrical connections to a ball grid array (BGA) or fine ball grid array (FBGA). The black oxide prevents solder from adhering to the traces except where desired.

Black oxide may also be used to promote adhesion between the die and the substrate. In a preferred embodiment of the invention, all of the black oxide layers in a particular device are formed at the same time, and all such layers have essentially the same amount of surface roughness appropriate for obtaining the desired adhesion.

The black oxide layers preferably do not cover the entire surfaces of the semiconductor device. The black oxide layers grow only on the surfaces of the copper traces. Consequently, the dimensions of the finished device may be minimized.

The present invention also relates to a packaged semiconductor device that has a semiconductor die, copper traces for connecting the die to an external device, and copper oxide layered on the copper traces. The semiconductor die may be encapsulated in resin. The traces may be electrically connected to a solder ball grid array.

The present invention also relates to an electrical conductor system for use in a semiconductor device. The system has metal traces for connecting the semiconductor device to an external device, and metal oxide located on and masking portions of the metal traces.

The present invention also relates to a method of making a semiconductor device. The method includes the following steps: forming copper conductors on a substrate; growing copper oxide on the copper conductors; removing the copper oxide from portions of the conductors; and attaching conductive metal (e.g., gold plate and solder balls) to the portions of the conductors where the oxide is removed.

The present invention also relates to a method of making a conductor system, including the following steps: forming metal traces on a substrate (e.g., an organic substrate or a semiconductor die); forming cupric oxide on the metal traces; and attaching conductive metal to the traces (e.g., by depositing gold on exposed portions of the traces).

These and other features and advantages will become apparent from the following detailed description of preferred embodiments of the invention.

DETAILED DESCRIPTION OF PREFERRED EMBODIMENTS

Figure 1:
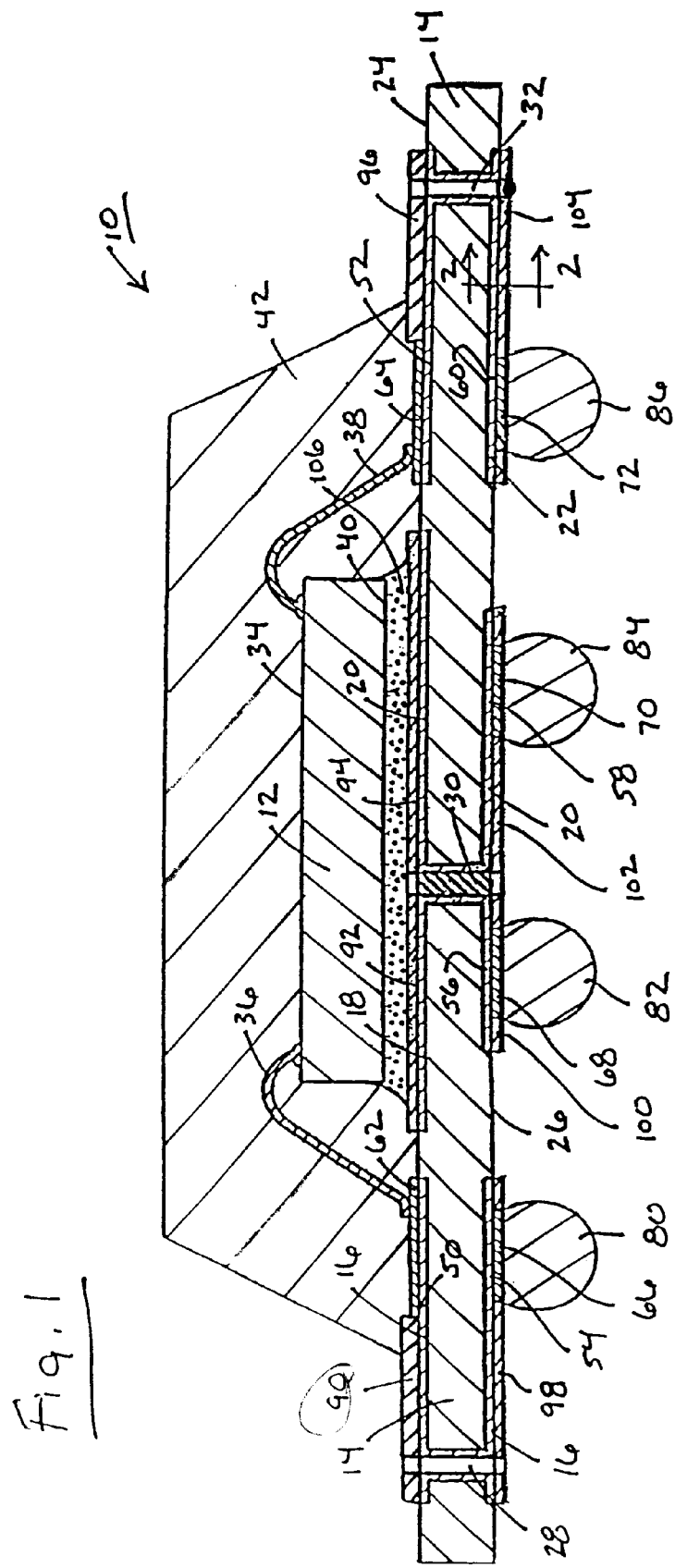
FIG. 1 is a cross sectional view of a semiconductor device constructed in accordance with a preferred embodiment of the invention.

Referring now to the drawings, where like reference numerals refer to like elements, there is shown in FIG. 1 a semiconductor device 10 constructed in accordance with a preferred embodiment of the present invention. The device 10 has a die (or chip) 12 mounted on an organic substrate 14. Copper traces 16, 18, 20, 22 are patterned on the top and bottom surfaces 24, 26 of the substrate 14.

The traces 16–22 extend through via holes 28, 30, 32 in the substrate 14. Some of the traces 16, 22 are connected to the active surface 34 of the chip 12 by wires 36, 38. The other traces 18, 20 are connected to via holes (not shown) in the bottom surface 40 of the chip 12. The chip 12 may be encapsulated in resin 42, if desired.

The copper traces 16–22 have bonding regions 50, 52, 54, 56, 58, 60. Gold plates 62, 64, 66, 68, 70, 72 are electro-deposited on the respective bonding regions 50–60. The gold plates 62–72 prevent copper oxidation at the bonding regions 50–60. Another suitable oxidation-resistant, conductive material may be used instead of gold, if desired. Solder balls 80, 82, 84, 86 are attached to the gold plates 66–72 on the bottom surface 26 of the substrate 14. The solder balls 80–86 form a ball grid array.

Thus, the illustrated wires 36, 38 connect die contacts (or bond pads) on the active surface 34 to the corresponding gold-plated copper traces 16, 22. The copper traces 16, 22 extend across and through the substrate 14 and connect to the corresponding solder balls 80, 86.

The portions of the traces 16–22 that are not gold plated are covered by layers of copper oxide 90, 92, 94, 96, 98, 100, 102, 104. In a preferred embodiment of the invention, the layers of copper oxide 90–104 consist essentially of black oxide (CuO).

Black oxide is typically thicker than native copper oxide. Black oxide for the present invention may be about ten to one thousand angstroms thick, for example. Native copper oxide is usually less than about three angstroms thick. Moreover, black oxide may be a better electrical insulator than native copper oxide.

Figure 2:
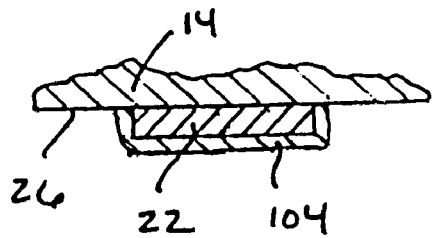
FIG. 2 is a partial cross sectional view of the semiconductor device of FIG. 1, taken along the line 2—2.

As shown in FIG. 2, the layers of black oxide 104 cover the copper traces 22 but do not cover the surface 26 of the substrate 14.

The black oxide layers 98–104 prevent the solder material 80–86 from contacting multiple bonding regions 54–60. The oxide layers 98–104 also prevent solder from flowing down the lengths of the conductive traces 16–22. An advantage of the invention is that it does not require a solder mask formed of resist material. According to the invention, oxide layers 98–104 perform the role of preventing solder 80–86 from adhering to the copper traces 98–104 except where desired.

In addition, the black oxide layers 92, 94 on the top surface 24 promote secure adhesion of the die 12 to the substrate 14. The black oxide material 92, 94 has a rough textured surface to provide good adhesion to the die attach material 106.

Figure 3:
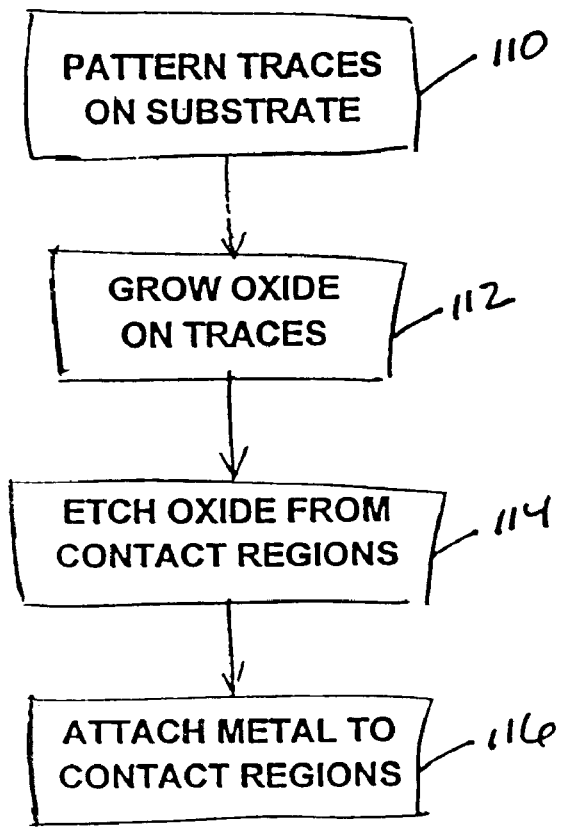
FIG. 3 is a flow chart for a method of making semiconductor devices in accordance with a preferred embodiment of the invention.

Referring now to FIG. 3, the device of FIG. 1 may be manufactured according to the following method: First, the copper traces 16–22 are patterned on the substrate 14 (Step 110). The traces 16–22 may be deposited in a variety of ways known in the art. The substrate 14 may be an organic substrate, the surface of the chip itself, etc. The invention is not limited to the particular substrates described herein.

Next, cupric oxide 90–104 is grown on the copper traces 16–22 (Step 112). In a preferred embodiment of the invention, a single oxide growing step (Step 112) may be used to provide solder masks 98–104 for the traces 16–22 and also to provide the desired rough surface 92, 94 for adhesion of the chip 12 to the substrate 14. Then, black oxide is etched from the bonding or contact regions 50–60 (Step 114). A physical mask like those used in plating processes may be used during the etching step. Then, gold 62–72 is plated (Step 116) onto the exposed contact regions 50–60 to provide the desired electrical connections to the wires 36, 38 and solder balls 80–86.

In an alternative embodiment of the invention, the black oxide insulating layers may be formed on the conductive copper traces after the gold plating step.

In yet another embodiment of the invention, a mask (not illustrated) is placed on the traces before the black oxide is formed. The mask prevents the black oxide from forming at the contact regions 50–60. Then gold or another suitable material is formed at the contact regions 50–60. According to this alternative embodiment of the invention, the step of removing black oxide from the contact regions may be avoided.

The invention is described above with reference to a semiconductor device in which a chip or die is plastic mounted on an organic substrate, with a ball grid array attached to the bottom surface of the substrate. The present invention is not limited to such devices, however. The invention is generally applicable to a wide variety of semiconductor devices that employ conductive metal traces or patterns.

For example, the invention is applicable to leads-on-chip devices where the chip itself forms a substrate and copper traces are patterned on the chip surface. In addition, the invention may be used in tape-based substrates or interposer devices where solder balls are formed on either side of a semiconductor chip.

What is claimed as new and desired to be protected by Letters Patent of the United States is:

1. A semiconductor device, comprising:
   semiconductor active elements;
   metal traces for connecting said active elements to an external device, wherein said metal is copper; and
   insulating layers on said metal traces, said insulating layers including black oxide, wherein said black oxide is a substitute for a solder resist mask.

2. The semiconductor device of claim 1, further comprising a semiconductor die, said active elements being located on said die.

3. The semiconductor device of claim 2, further comprising means for connecting to said semiconductor active elements and said metal traces.

4. The semiconductor device of claim 1, further comprising a ball grid array for connecting said metal traces to the external device.

5. The semiconductor device of claim 4, further comprising gold plates for connecting said metal traces to said ball grid array.

6. A packaged semiconductor device, comprising:
   a semiconductor die;
   copper traces for connecting said semiconductor die to an external device; and
   black oxide for masking said copper traces, wherein said black oxide forms a thick insulating layer which is capable of serving as a solder resist mask.

7. The packaged semiconductor device of claim 6, further comprising a substrate for supporting said die, said substrate having first and second surfaces, said copper traces being located on said first surface of said substrate.

8. The packaged semiconductor device of claim 7, further comprising a ball grid array for connecting said copper traces to the external device, said ball grid array being located on said second surface of said substrate.

9. The packaged semiconductor device of claim 8, further comprising gold between said copper traces and said ball grid array.

10. The packaged semiconductor device of claim 7, further comprising via holes in said substrate for connecting said semiconductor die to the external device, said via holes being electrically connected to said copper traces.

11. An electrical conductor system for a semiconductor device, said system comprising:

metal traces for connecting the semiconductor device to an external device, wherein said metal is copper; and black oxide for masking portions of said metal traces, said black oxide being an insulator and located on said portions of said metal traces and serving as a substitute for a solder mask.

12. The electrical conductor system of claim 11, further comprising a ball grid array for connecting said metal traces to the external device.

13. The electrical conductor system of claim 12, further comprising gold for connecting said metal traces to said ball grid array.

14. The electrical conductor system of claim 13, wherein said metal oxide is adjacent said gold to prevent said ball grid array from contacting said metal traces.

15. A packaged semiconductor device, comprising:

a substrate having top and bottom surfaces;

a semiconductor die mounted on said substrate;

first, second and third copper traces formed on said substrate, said first and second traces being located on said top surface of said substrate, said third traces being located on said bottom surface of said substrate;

first, second and third layers of black oxide formed on said first, second and third copper traces, respectively, wherein said first, second, and third layers of black oxide serves as a substitute for a solder mask;

die attach material adhered to said semiconductor die and said first layers of black oxide;

oxidation resistant metal electro-deposited on said third traces; and a solder ball attached to said oxidation resistant metal.

16. The packaged device of claim 15, further comprising via holes connecting said second traces to said third traces.

17. The packaged device of claim 16, wherein said semiconductor die is encapsulated in resin.

18. The packaged device of claim 17, further comprising a ball grid array attached to said third traces for electrical communication with said semiconductor die.

19. A packaged semiconductor device, comprising:

a substrate having top and bottom surfaces;

a semiconductor die mounted on said substrate;

first, second and third copper traces formed on said substrate, said first and second traces being located on said top surface of said substrate, said third traces being located on said bottom surface of said substrate;

black oxide formed on said copper traces, wherein said black oxide serves as a substitute for a solder mask; and a layer of black oxide, said layer of black oxide being disposed between said substrate and said semiconductor die.

* * * * *